(12) United States Patent
Nair

(10) Patent No.: US 7,726,186 B2
(45) Date of Patent: Jun. 1, 2010

(54) AIRFLOW SENSOR FOR FILTER BLOCKAGE DETECTION

(75) Inventor: Rajesh M. Nair, Nashua, NH (US)

(73) Assignee: Degree Controls, Inc., Milford, NH (US)

( * ) Notice: Subject to any disclaimer, the term of this patent is extended or adjusted under 35 U.S.C. 154(b) by 205 days.

(21) Appl. No.: 11/458,630

(22) Filed: Jul. 19, 2006

(65) Prior Publication Data

US 2008/0198896 A1 Aug. 21, 2008

(51) Int. Cl.
G01F 1/68 (2006.01)
G08B 21/00 (2006.01)
H05K 5/00 (2006.01)
B01D 46/46 (2006.01)

(52) U.S. Cl. .............. 73/204.25; 340/607; 454/184; 95/25

(58) Field of Classification Search ............ None
See application file for complete search history.

(56) References Cited

U.S. PATENT DOCUMENTS

| | | | | |
|---|---|---|---|---|
| 3,504,542 A | * | 4/1970 | Blevins | 73/861.52 |
| 4,571,996 A | * | 2/1986 | Wakeman et al. | 73/202.5 |
| 5,429,649 A | * | 7/1995 | Robin | 96/405 |
| 5,467,607 A | | 11/1995 | Harvey | |
| 5,668,535 A | * | 9/1997 | Hendrix et al. | 340/607 |
| 5,769,705 A | | 6/1998 | O'Callaghan et al. | |
| 6,128,963 A | * | 10/2000 | Bromster | 73/861.52 |
| 6,319,114 B1 | | 11/2001 | Nair et al. | |
| 6,507,282 B1 | * | 1/2003 | Sherwood | 340/607 |
| 6,539,968 B1 | * | 4/2003 | White et al. | 137/10 |
| 6,917,891 B2 | * | 7/2005 | Rothfuss et al. | 73/861.04 |
| 7,048,383 B2 | * | 5/2006 | Belliveau | 353/57 |
| 7,178,410 B2 | * | 2/2007 | Fraden et al. | 73/861.52 |
| 7,234,312 B2 | * | 6/2007 | Violand et al. | 62/115 |
| 7,334,602 B2 | * | 2/2008 | Ahn | 137/487.5 |
| 2004/0177703 A1 | * | 9/2004 | Schumacher et al. | 73/861.52 |
| 2007/0272082 A1 | * | 11/2007 | Johansson | 96/417 |
| 2007/0277592 A1 | * | 12/2007 | Johansson et al. | 73/38 |

FOREIGN PATENT DOCUMENTS

| | | | |
|---|---|---|---|
| DE | 202004011074 | * | 12/2004 |
| FR | 2701217 A1 | * | 8/1994 |
| JP | 60062518 A | * | 4/1985 |
| JP | 02157495 | | 6/1990 |

* cited by examiner

Primary Examiner—Harshad Patel
(74) Attorney, Agent, or Firm—Schwegman, Lundberg & Woessner, P.A.

(57) ABSTRACT

A thermal management system includes an airflow sensor that measures airflow in an air path inside an enclosure to be cooled, wherein the air path includes a filter and a fan. A controller is responsive to the airflow sensor for monitoring the rate of airflow inside the enclosure and determining the condition of the filter. In one embodiment, the airflow sensor is an active type sensor, such as a thermistor, disposed on circuit boards. In further embodiments, the airflow sensor is disposed proximate a tube through the filter.

19 Claims, 4 Drawing Sheets

AIRFLOW SENSOR FOR FILTER BLOCKAGE DETECTION

BACKGROUND

Thermal management systems generally include an enclosure such as a housing or cabinet for heat generating electronic component circuit cards or boards which must be cooled to prevent damage to the electronic components. A variable speed fan may be used to force air over the components and a temperature sensor and/or an air flow sensor monitors the temperature and/or air flow rate of the air or other cooling gas inside the cabinet.

A filter is used to reduce particulate matter in order to eliminate contaminants which could otherwise foul the circuit cards. A controller, connected to the fan and responsive to the temperature sensor and/or the air flow sensor, continuously monitors the temperature of the electronic circuit cards and may adjust the speed of the fan to keep the electronic components cool.

Such prior art systems, however, may detect temperature increases too late to gracefully shut down electronics being cooled. A graceful shut down would allow data to be saved prior to removing power to the electronics.

As circuitry has decreased in size, it is more sensitive to increases in temperature. Further, the resistance to airflow that such smaller circuitry presents is now comparable to that provided by filters. Thus, any blockage of a filter more quickly lowers airflow and adversely affects the circuitry. Common practice today is to schedule filter replacement on a set schedule, such as every six months. This practice does not take into account the environment where the filter may be located. In a dusty environment, the filter may need to be replaced more quickly. In a clean room environment, filter may last much longer than six months.

Further, prior art systems may utilize pressure sensor based airflow sensing in an effort to detect filter blockage. For airflow ranges seen in electronics enclosures, a pressure sensor with low measurement range is required. These sensors are large and susceptible to shock and vibration. They are also sensitive to mounting orientation. With smaller circuitry, the larger sensors become unwieldy and inaccurate. They may also fail to properly detect whether the filter is clogged to the point where cooling is no longer effective. Again, when the filter is clogged, the air flow rate through the cabinet may be less than optimal even at the highest fan speed resulting in component failure, thermal stress, or degradation which may not be detectable.

SUMMARY

A thermal management system utilizes an airflow sensor that measures airflow in an air path inside an enclosure to be cooled. The air path includes a filter and a fan. A controller is responsive to the active airflow sensor and monitors the rate of airflow inside the enclosure which is representative of the condition of the filter.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

The functions or algorithms described herein are implemented in software or a combination of software and human implemented procedures in one embodiment. The software may consist of computer executable instructions stored on computer readable media such as memory or other type of storage devices. The term "computer readable media" is also used to represent any means by which the computer readable instructions may be received by the computer, such as by different forms of wireless transmissions. Further, such functions correspond to modules, which are software, hardware, firmware or any combination thereof. Multiple functions are performed in one or more modules as desired, and the embodiments described are merely examples. The software is executed on a digital signal processor, ASIC, microprocessor, or other type of processor operating on a computer system, such as a personal computer, server or other computer system.

Figure 1:
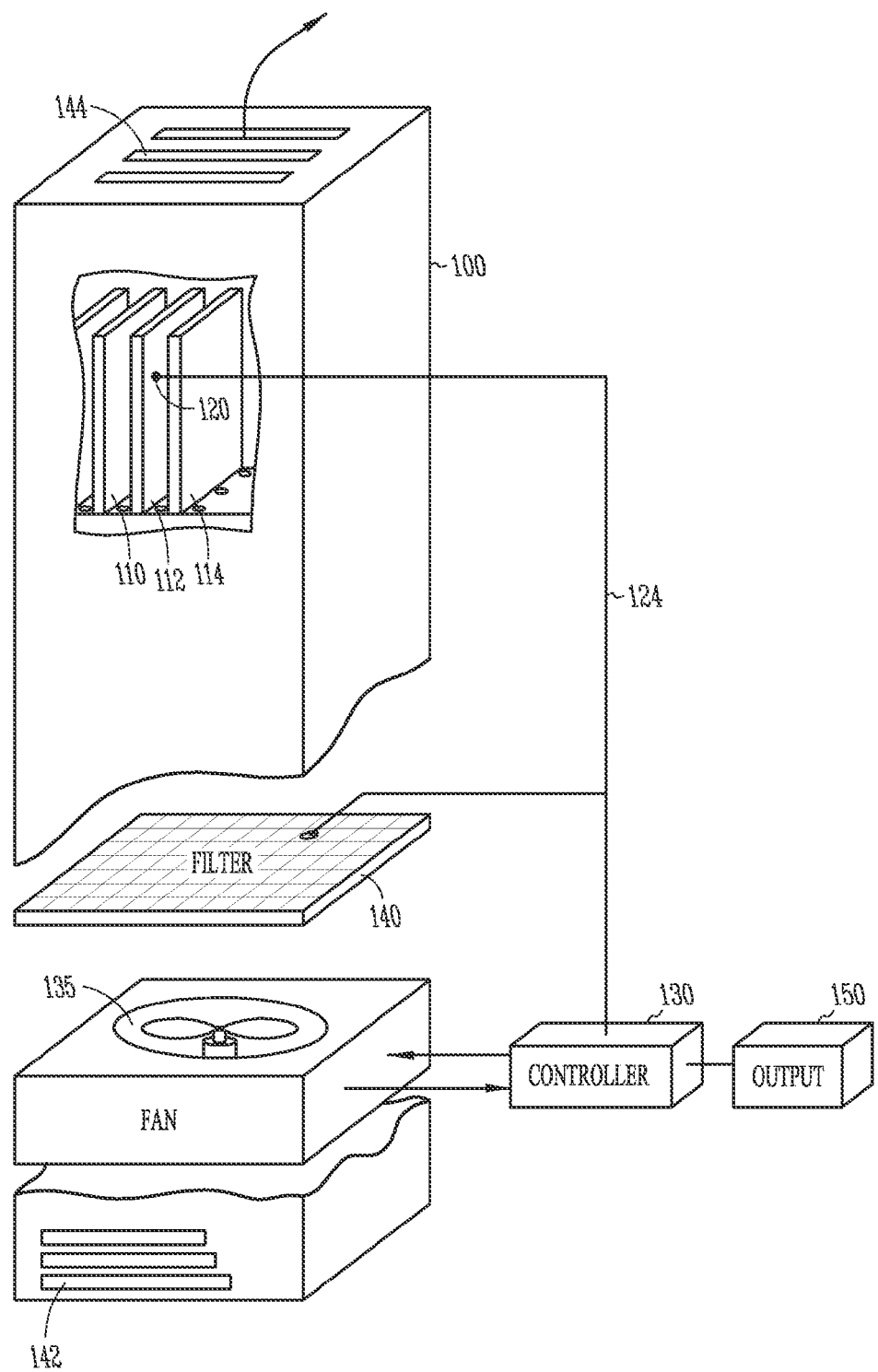
FIG. 1 is a simplified perspective view of an electronics enclosure having filter blockage detection according to an example embodiment.

FIG. 1 is a simplified perspective view of an electronics enclosure 100 having filter blockage detection according to an example embodiment. The electronics enclosure 100 has multiple devices which generate heat, such as circuit cards 110, 112 and 114. In one embodiment, at least one of the circuit cards, such as card 112 has an active airflow sensor 120 disposed thereon with suitable connection 124 to a controller 130. In one embodiment, the airflow sensor 120 is a pulsed thermistor, that may be fairly small and easily implementable on a circuit board or card. The airflow sensor 120 may be positioned proximate circuitry on the circuit card that is most sensitive to heat, or otherwise positioned as desired to measure airflow across the circuit card. In some embodiments, the sensor may be integrated directly on the card, and formed during manufacture of the card with other circuitry on the card.

Airflow sensor 120 is said to be active in that it uses energy in order to sense airflow. In one form, a pulsed thermistor (or other temperature dependent resistive device) is heated and the cooling of the thermistor is measured to determine airflow. Such thermistors may be very small, and easily implemented on circuit cards at one or more desired locations.

Airflow is provided by a fan 135 in one embodiment, which may be a variable speed fan. Fan 135 is coupled to controller 130 in one embodiment to control the speed of the fan to increase airflow and correspondingly decrease temperature of the circuit cards. A filter 140 may also be provided in an airflow path that begins at openings 142 in enclosure 100, traveling through the fan 135, filter 140, past the circuit cards 110, 112, 114 and other heat producing components as desired, exiting the enclosure 100 at openings 144.

Controller 130 in one embodiment, monitors the airflow, and detects when airflow has changed and is indicative of a filter that is becoming or is blocked. The term blocked as used herein means that the filter has become clogged with particulate matter, and the resistance it provides to airflow has increased. While still allowing air to flow through it, the airflow may not be adequate to sufficiently cool the components in the enclosure 100. This may be determined by the airflow rate reaching or passing a predetermined threshold, or by more complex algorithms. It may also be a function of air temperature in various embodiments. For instance, a lower air temperature may result in less flow being needed to adequate cool the components. Once the controller determines that the airflow is insufficient, it generates a signal to an output device 150, which may sound an audible alarm or provide some visual alarm or indication of the need to replace the filter. The alarm may be in the form of a message or blinking icon in various embodiments that are designed to call an operator's attention to the need for filter replacement.

Figure 2:
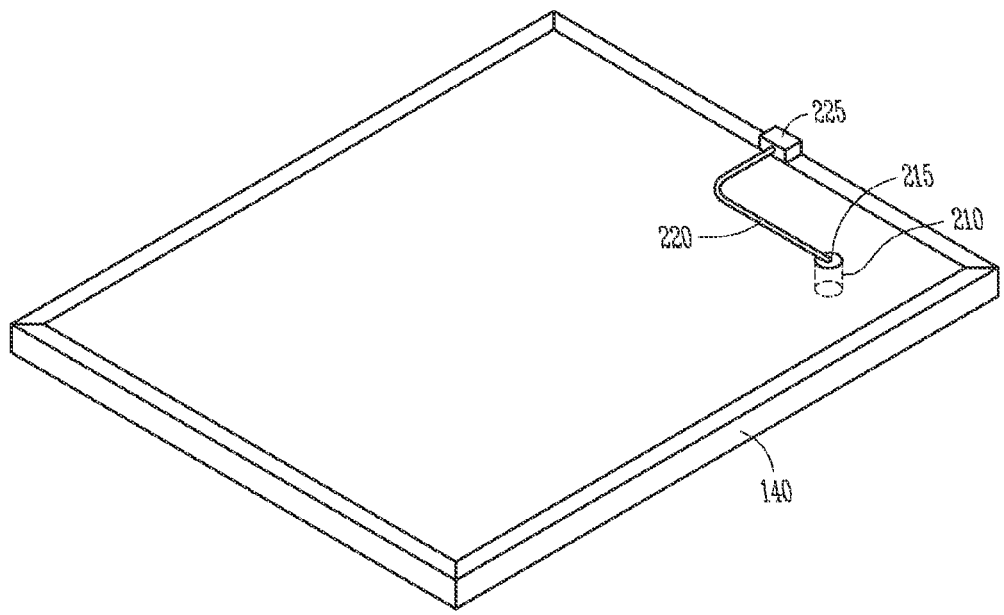
FIG. 2 is a perspective view of a filter cartridge having an integrated airflow sensor according to an example embodiment.

In a further embodiment, an airflow sensor may be combined or integrated into the filter 140 as illustrated in perspective view in FIG. 2. In one embodiment, the filter 140, which may be a common filter material optionally encased in frame, has a tube 210 disposed through it that allows air to flow. The tube may be positioned anywhere through the filter material or adjacent to it, such as through a frame, but is positioned such that airflow through the tube 210 is representative of airflow through the filter 140. In one embodiment, the tube 210 is very small in diameter, such as approximately 1 mm in diameter, such that very little air bypasses the filter material and air quality within enclosure 100 is not significantly adversely affected. In further embodiments, the shape of the tube may be varied from circular to other shapes, such as rectangular or other shape. In still further embodiments, the tube simply comprises an opening through the filter. The filter material may be fused to provide a wall that forms the tube, or any type of opening designed to stand up to environmental conditions and maintain its shape may be used.

An airflow sensor 215 is positioned proximate the tube, such as at or near either end, or within the tube, to provide an airflow indication representative of airflow through the tube. In one embodiment, the airflow sensor is a thermistor type airflow sensor, where an element is heated, and cooling of the element is representative of the flow of fluid such as air, past the element. Such thermistors are commercially available, and may be made small enough to fit within fairly small tubes. Power to the thermistor, as well as signals from the thermistor may be provided by line 220, which may be one or more conductive lines to provide current to heat the thermistor, as well as carry signals from the thermistor back to the controller 130 for analysis. In further embodiments, the thermistor may be battery powered, or powered by some other means 225, such as solar or by the airflow it is designed to measure. Small turbines may be used to power the sensor in further embodiments. The sensor may also have wireless capabilities for transmitting sensed airflow information. In still further embodiments, other types of sensors may be used to measure flow through the tube, such as non-active types of sensors, including turbines or other mechanically based sensors that rotate or bend (piezoelectric type) in response to airflow.

In one embodiment, the airflow through the filter is inversely proportional to the amount of blockage accumulated on the filter. The flow through the sensor is a linear function of pressure across the filter which is proportional to blockage. In other words, as the filter becomes more clogged, it allows less air to flow through it, building up pressure upstream of the filter. This increase in pressure results in an increase in the airflow through the tube, which is detected by the sensor 210. The controller 130 receives signals from the sensor 210 indicating the airflow levels, and may compare such levels to predetermined thresholds to determine whether or not the filter is blocked and should be replaced. In further embodiments, various algorithms in the controller may be used to track the rates at which a filter is becoming blocked, and provide predictions of when the filter should be replaced. This may be valuable in dusty environments, since a filter may become quickly blocked by dust. If an operator can see this happening, plans may be made to ensure filters are available when needed. The pressure developed across the filter depends on filter blockage and the speed of the fan that is generating airflow. If the fan speed is kept constant, the pressure across the filter directly represents its blockage. In an application where the fan speed is variable, the fan speed information may be used to normalize the pressure reading to determine filter blockage. In further embodiments, other algorithms, such as a table indexed by fan speed and pressure reading, may be used to determine filter blockage.

In a further embodiment, where sensor 120 proximate the circuit cards 110, 112, 114 is used, the airflow is inversely proportional to the amount of blockage of the filter. In other words, as the filter becomes more blocked with dust or other particles, the airflow through it, and thus past the sensor 120 decreases. If the fan speed is kept constant, the airflow reading directly represents the blockage level. If the fan speed is variable an additional compensation for fan speed is used in the controller 130. The controller 130 may again use a threshold to determine when the filter should be replaced. Historical temperature and or airflow data may be used to establish the threshold. The airflow can be associated with circuit card temperatures to more effectively estimate when the temperature of a circuit will exceed safe operating levels. Airflow is a leading indicator of such temperature excursions, and therefore may provide more advanced warnings of the need for replacement. Such advanced warnings may help ensure the ability to replace filters efficiently, and further allow for graceful shut down of electronics if the filter is not replaced prior to potentially damaging heat buildup.

Figure 3:
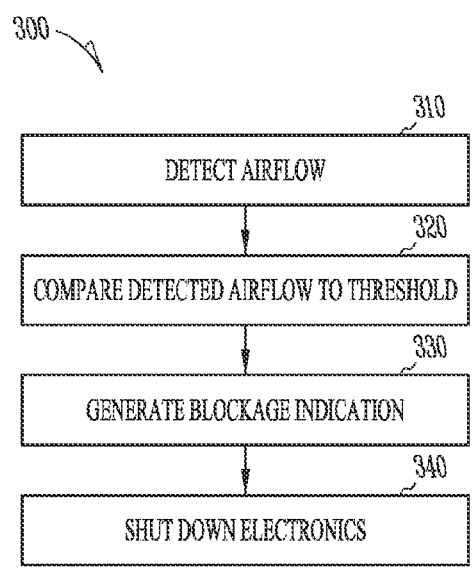
FIG. 3 is a flow chart illustrating a process for detecting a blocked filter in an airflow path according to an example embodiment.

FIG. 3 is a flow chart illustrating a process for detecting a blocked filter in an airflow path according to an example embodiment. Airflow is detected at 310 from either sensor 210 or one or more sensors 120. In some embodiments both types of sensors may be used. At 320, the detected airflow or airflows is compared to one or more thresholds. If a threshold is exceeded or passed at 330, a signal indicating blockage of the filter, or indicating that the filter needs to be replaced is provided at 330. These different indications may each have an associated threshold, such that the system first provides a filter replacement indication, then as the second threshold is passed, a shut down of electronics may be initiated at 340. The second threshold may be set at a level that provides sufficient time to allow a graceful shutdown of the electronics. A graceful shutdown allows the electronics to save current information and status to allow the electronics to be turned back on without loss of data, and such that they may be turned back on in the same state they were in prior to shutdown.

Figure 4:
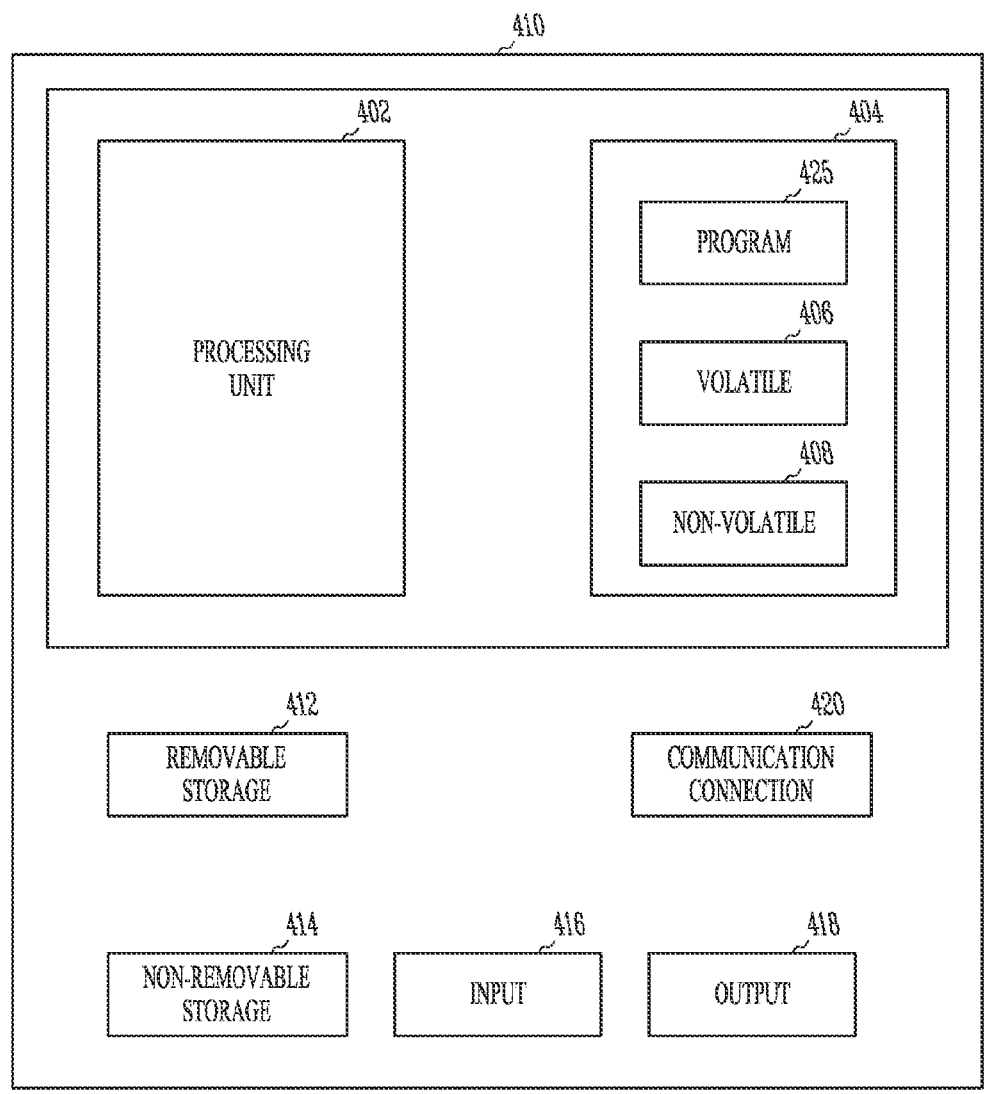
FIG. 4 is a block diagram of a controller according to an example embodiment.

FIG. 4 is a block diagram of a controller that may execute programming 425 for performing the above algorithms. A general computing device in the form of a computer 410, may include a processing unit 402, memory 404, removable storage 412, and non-removable storage 414. Memory 404 may include volatile memory 406 and non-volatile memory 408.

Computer 410 may include—or have access to a computing environment that includes—a variety of computer-readable media, such as volatile memory 406 and non-volatile memory 408, removable storage 412 and non-removable storage 414. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 410 may include or have access to a computing environment that includes input 416, output 418, and a communication connection 420. The computer may operate in a networked environment using a communication connection to connect to one or more remote computers. The remote computer may include a personal computer (PC), server, router, network PC, a peer device or other common network node, or the like. The communication connection may include a Local Area Network (LAN), a Wide Area Network (WAN) or other wired or wireless networks.

Computer-readable instructions stored on a computer-readable medium are executable by the processing unit 402 of the computer 410. A hard drive, CD-ROM, and RAM are some examples of articles including a computer-readable medium.

Figure 5:
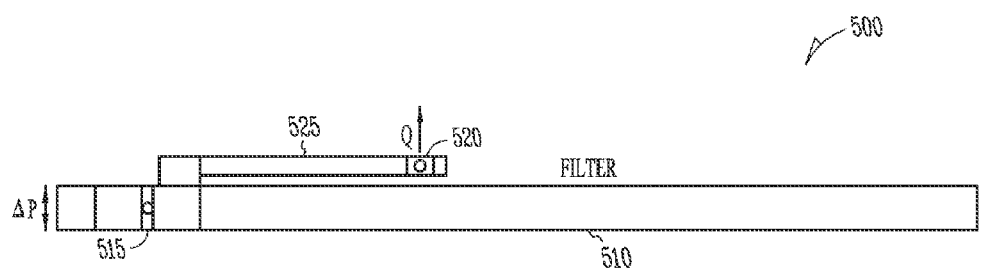
FIG. 5 is a cross section view of a filter cartridge having a differential pressure sensor for measuring a difference in pressure across the filter according to an example embodiment.

In a further embodiment illustrated at 500 in FIG. 5, a filter 510 has a pressure sensor 515 associated with it to measure a difference in pressure across the filter 510. Many different types of differential pressure sensors may be used, such as capacitive type pressure sensors with the difference in pressure applied across a diaphragm that bends in response to the pressure difference. In one embodiment, pressure sensor 515 is simply an airflow sensor and tube combination for measuring airflow through the tube. As indicated above, the airflow through the tube is a function of the pressure difference across the filter. Information from the pressure sensor, such as a differential pressure sensor is combined with information from an airflow sensor 520 in the airflow path. Airflow sensor 520 and pressure sensor 515 may be formed with or integrated with the filter and/or filter frame as a package. In one embodiment, an arm 525 is attached to the filter, and positions the airflow sensor in a path of air flowing through the filter. Arm 525 may be attached to the tube of the pressure sensor 515, optionally forming a single integrated piece that may be supported by the tube through the filter. Airflow sensor 520 may optionally be located proximate the electronics to be cooled.

Both sensors provide information to the controller to generate a signal indicative of filter blockage. This filter blockage signal may be derived from the pressure differential and airflow indication without regard to the fan speed. The ratio of pressure to airflow represents the filter blockage (Ohm's law). The combination of pressure and airflow sensors may be provided in an assembly, and can read filter blockage independent of fans speed or system resistance. It may also be used to detect a damaged filter, such as one that is ripped or torn, or otherwise allows significant airflow around the filter material. In such cases, the resistance will be below a selected threshold.

In further embodiments, the controller may be integrated or otherwise attached to the filter, providing a single replaceable unit. A battery or other source of power for the controller and sensors, such as a connector for external power may be included with the filter. The controller may include a light, such as an LED or other type of display device that is controlled by the controller to indicate that the filter is blocked or becoming blocked and should be replaced. In one embodiment, the controller may be supported by the tube of sensor 515. In further embodiments, it may be supported by the arm 525. The controller is electrically coupled to one or more of the sensors as desired. The same structure as shown in FIG. 5 may be used with one or both of the sensors. For instance, just using sensor 520, with the tube of sensor 515 closed off or even left open, allows one to measure airflow through the filter. This is useful at least in embodiments with a single fan speed, or if multiple fan speeds, providing a fan speed indication to the controller. Similarly, just sensor 515 may be used to determine the difference in pressure across the filter. These embodiments provide a self contained filter assembly that is easily replaced.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A thermal management system comprising:
    an active airflow sensor that measures airflow in an air path inside an enclosure to be cooled, wherein the air path includes a filter and a fan, and wherein the active airflow sensor is intergrated with the filter, a separate sensor to measure airflow through the filter;
    a separate sensor to measure airflow through the filter; and
    a controller responsive to the airflow sensor for monitoring the measured airflow inside the enclosure and determining the condition of the filter, wherein the active airflow sensor provides airflow information to the controller that determines when the filter should be replaced, and wherein the controller initiates a graceful shut down of electronics within the enclosure as a function of measured airflow.

2. The thermal management system of claim 1 wherein the active airflow sensor measures airflow through a tube through the filter.

3. The thermal management system of claim 2 wherein the tube is integrated with the filter.

4. The thermal management system of claim 3 wherein the tube is approximately 1 mm in diameter.

5. The thermal management system of claim 3 wherein airflow through the tube does not significantly adversely affect the air quality within the enclosure.

6. The thermal management system of claim 2 wherein the active airflow sensor comprises a heated thermistor.

7. The thermal management system of claim 1 wherein the active airflow sensor is mounted on a circuit board within the enclosure.

8. The thermal management system of claim 1 wherein the airflow sensor communicates with the controller via wired or wireless connection.

9. A thermal management system comprising:
    an airflow path inside an enclosure to be cooled, wherein the air path includes a filter and a fan;
    an airflow sensor disposed within the filter to measure airflow inside the enclosure;
    a second sensor supported within the enclosure to measure airflow through the filter; and
    a controller responsive to the airflow sensor and second sensor for monitoring the measured airflow inside the enclosure and determining the condition of the filter.

10. The thermal management system of claim 9 and further comprising a tube through the filter, wherein the airflow sensor is disposed to measure airflow through the tube.

11. The thermal management system of claim 10 wherein the tube is integrated with the filter.

12. The thermal management system of claim 11 wherein the tube is approximately 1 mm in diameter.

13. The thermal management system of claim 11 wherein airflow through the tube does not significantly adversely affect the air quality within the enclosure.

14. The thermal management system of claim 9 wherein the airflow sensor comprises a temperature dependent resistive device.

15. The thermal management system of claim 9 wherein the airflow sensor provides airflow information to the controller that determines when the filter should be replaced.

16. The thermal management system of claim 15 wherein the controller initiates a graceful shut down of electronics within the enclosure as a function of measured airflow.

17. A filter for an air path of an enclosure to be cooled by moving air, the filter comprising:
  a tube disposed through the filter for providing a laminar air path through the filter;
  an active airflow sensor coupled to the tube that provides a signal representative of airflow through the filter;
  a second sensor supported within the enclosure to measure airflow through the filter; and
  a controller responsive to the airflow sensor and second sensor for determining the condition of the filter.

18. A filter for a laminar flow air path of an enclosure to be cooled by moving air, the filter comprising:
  a filter assembly formed to fit in the laminar flow air path of the enclosure;
  a first sensor supported by the filter assembly that detects a difference in pressure across the filter;
  a second active sensor supported by the filter assembly that detects airflow through the filter; and
  a controller supported by the filter assembly responsive to the first and second sensors for monitoring the rate of airflow inside the enclosure and determining the condition of the filter.

19. The filter of claim 18 wherein the condition of the filter is a function of the ratio of the difference in pressure to the airflow.

* * * * *

UNITED STATES PATENT AND TRADEMARK OFFICE
CERTIFICATE OF CORRECTION

PATENT NO. : 7,726,186 B2  Page 1 of 1
APPLICATION NO. : 11/458630
DATED : June 1, 2010
INVENTOR(S) : Rajesh M. Nair It is certified that error appears in the above-identified patent and that said Letters Patent is hereby corrected as shown below:

In column 6, line 26, in Claim 1, delete "intergrated" and insert -- integrated --, therefor.

Signed and Sealed this

Third Day of August, 2010

David J. Kappos
*Director of the United States Patent and Trademark Office*